US009033714B2

(12) United States Patent
Kimura et al.

(10) Patent No.: US 9,033,714 B2
(45) Date of Patent: May 19, 2015

(54) CONNECTOR FOR MOUNTING ON A BOARD

(71) Applicants: JAPAN AVIATION ELECTRONICS INDUSTRY, LIMITED, Shibuya-ku, Tokyo (JP); JAE TAIWAN, LTD., Taichung (TW)

(72) Inventors: Masaki Kimura, Tokyo (JP); Yohei Yokoyama, Tokyo (JP); Kouji Kawase, Taichung (TW); Masafumi Kodera, Taichung (TW)

(73) Assignees: JAPAN AVIATION ELECTRONICS INDUSTRY, LIMITED, Tokyo (JP); JAE TAIWAN, LTD., Taichung (TW)

( * ) Notice: Subject to any disclaimer, the term of this patent is extended or adjusted under 35 U.S.C. 154(b) by 142 days.

(21) Appl. No.: 13/860,358

(22) Filed: Apr. 10, 2013

(65) Prior Publication Data

US 2013/0273754 A1 Oct. 17, 2013

(30) Foreign Application Priority Data

Apr. 13, 2012 (JP) ................................ 2012-091522

(51) Int. Cl.
*H01R 12/00* (2006.01)
*H05K 1/00* (2006.01)
(Continued)

(52) U.S. Cl.
CPC .......... *H01R 13/7039* (2013.01); *H01R 12/725* (2013.01); *H01R 13/6594* (2013.01)

(58) Field of Classification Search
CPC ............. H01R 23/7068; H01R 23/725; H01R 23/6873
USPC ........... 439/62, 59, 325, 629, 607.32, 607.33, 439/607.35, 607.4, 79
See application file for complete search history.

(56) References Cited

U.S. PATENT DOCUMENTS 5,504,994 A * 4/1996 Banakis et al. ................. 29/884
5,807,137 A * 9/1998 Janota et al. ............. 439/607.33
(Continued)

FOREIGN PATENT DOCUMENTS

JP 2003-288967 A 10/2003
JP 3817489 B2 9/2006
(Continued)

OTHER PUBLICATIONS

Chinese Office Action dated Dec. 22, 2014, issued in counterpart Chinese Application No. 201310125114.4.

*Primary Examiner* — Hae Moon Hyeon
(74) *Attorney, Agent, or Firm* — Holtz, Holtz, Goodman & Chick, PC

(57) ABSTRACT

Provided is a connector to be securely fixed on a board, especially, the connector having a high-strength shell prevented from detached from the connector. The connector has a mating portion, a plurality of the contacts, a holding member holding the contacts and a shell and to be connected with a mating connector in a front-back direction. The mating portion is positioned in forward part of the connector. The holding member is formed with a protrusive portion protruding backward. The protrusive portion is formed with a receiving portion. An edge of the shell is formed a stopper portion. The stopper portion and the receiving portion face to each other in the front-back direction. The contact has a contact-fixing portion fixed on the board. The shell has a shell-fixing portion fixed on the board. A distance between the shell-fixing portion and the mating portion is larger than another distance between the contact-fixing portion and the mating portion.

6 Claims, 6 Drawing Sheets

(51) Int. Cl.

| | |
|---|---|
| ***H01R 13/703*** | (2006.01) |
| ***H01R 13/6594*** | (2011.01) |
| *H01R 12/72* | (2011.01) |

(56) References Cited

U.S. PATENT DOCUMENTS

| | | | | |
|---|---|---|---|---|
| 6,398,587 | B1 * | 6/2002 | Chen et al. | 439/607.35 |
| 6,733,307 | B2 * | 5/2004 | Wu | 439/79 |
| 7,182,641 | B2 | 2/2007 | Shimoyama | |
| 7,465,193 | B2 * | 12/2008 | Lin et al. | 439/607.01 |
| 7,785,149 | B2 * | 8/2010 | Kamata et al. | 439/607.35 |
| 2014/0113477 | A1 * | 4/2014 | Henzler | 439/345 |

FOREIGN PATENT DOCUMENTS

| | | | |
|---|---|---|---|
| JP | 2007-005234 | A | 1/2007 |
| JP | 2007-087902 | A | 4/2007 |
| JP | 2011-192409 | A | 9/2011 |
| JP | 2012-009358 | A | 1/2012 |

* cited by examiner

CONNECTOR FOR MOUNTING ON A BOARD

CROSS REFERENCE TO RELATED APPLICATIONS

Applicants claim priority under 35 U.S.C. §119 of Japanese Patent Application No. JP2012-091522 filed Apr. 13, 2012.

BACKGROUND OF THE INVENTION

This invention relates to a connector configured to be mounted and fixed on a board under a state where a mating portion protrudes from an edge of the board.

Connectors configured to be mounted on the board is disclosed in, for example, JP-A 2007-5234, JP-B 3817489 and JP-A 2011-192409. These connectors are illustrated in FIG. 11 to FIG. 12, respectively. As shown in FIG. 10 to FIG. 12, each of the connectors has a shell formed by bending a blank member obtained by processing a metal sheet. The shell is attached to the holding member as follows. The shell is put on a holding member from forward of the connector so as to cover the holding member. A part of the shell is bent in order to form a stopper portion. The stopper portion is brought into contact with the holding member, or the stopper portion is press-fitted into and held by the holding member.

Each of the connectors disclosed in JP-A 2007-5234 and JP-B 3817489 has a stopper portion. The stopper portion is formed on a surface of the bent shell, as described above. In other words, the surface of bent shell are brought into contact with the holding member so that the shell is attached to the holding member. However, if the shell is pulled forward or pushed backward, the stopper portion is deformed and open, and then the shell may be detached from the holding member.

On the other hand, the connector disclosed in JP-A 2011-192409 has another stopper portion formed on a part of an edge of a blank member of the shell. Therefore, strength of the stopper portion disclosed in JP-A 2011-192409 is higher than strength of the stopper portions disclosed in JP-A 2007-5234 and JR-B 3817489.

However, if the connector disclosed in JP-A 2011-192409 is mounted and fixed on a board under a state where a mating portion protrudes from an edge of the board, the connector may be easily inclined or off the board. In other words, the connector can not ensure strength required for mounting and fixing on the board. In addition, the holding member of the connector has protruding portions protruding from the shell in a right-left direction. The shell is formed with slits corresponding to the protruding portions. Edges of the slits serve as the stopper portions, and thus, force may concentrate to the slit. Therefore, the total strength of the shell may be decreased.

SUMMARY OF THE INVENTION

It is an object of the present invention to provide a connector configured to be mounted and fixed on a board under a state where a mating portion protrudes from an edge of the board, wherein the connector has a shell having high strength, ensures strength required for the connector to be firmly fixed on the board and is prevented from being detached from the holding member.

One aspect of the present invention provides a connector having a mating portion positioned at a front part of the connector and configured to be mounted and fixed on a board under a state where the mating portion being and protruding from an edge of the board, comprising: a plurality of contacts each of which has a contact-fixing portion to be fixed on the board; a holding member having a holding portion and a protrusive portion protruding backward from the holding portion, the holding portion holding the contacts, the protrusive portion being formed with a receiving portion and a mount surface mounted on the board; and a shell covering, at least in part the holding member and formed by bending a blank member obtained by processing a metal sheet. The shell is provided with a shell-fixing portion to be fixed to the board. The shell-fixing portion corresponds to the protrusive portion and is provided with a stopper portion. The stopper portion is a part of an edge of the blank member and faces the receiving portion in the front-back direction. A distance between the shell-fixing portion and the mating portion is larger than another distance between the contact-fixing portion and the mating portion.

An appreciation of the objectives of the present invention and a more complete understanding of its structure may be had by studying the following description of the preferred embodiment and by referring to the accompanying drawings.

Figure 1:
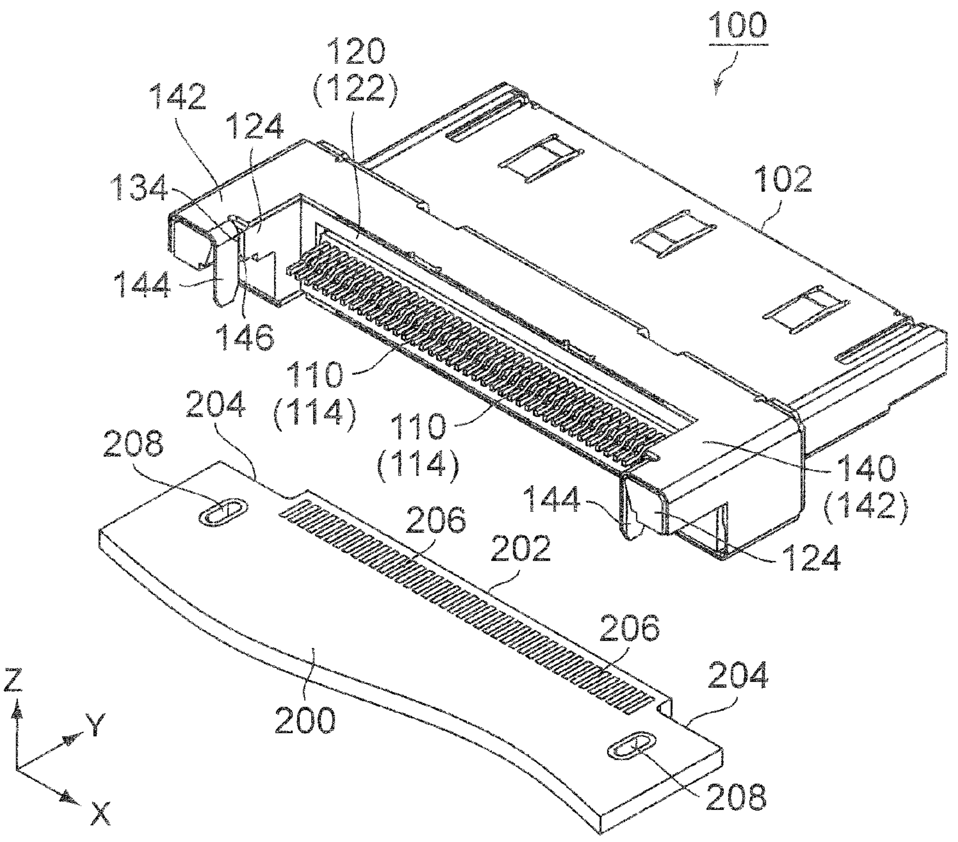
FIG. 1 is a rear oblique view showing a connector according to a first embodiment of the present invention.
Figure 2:
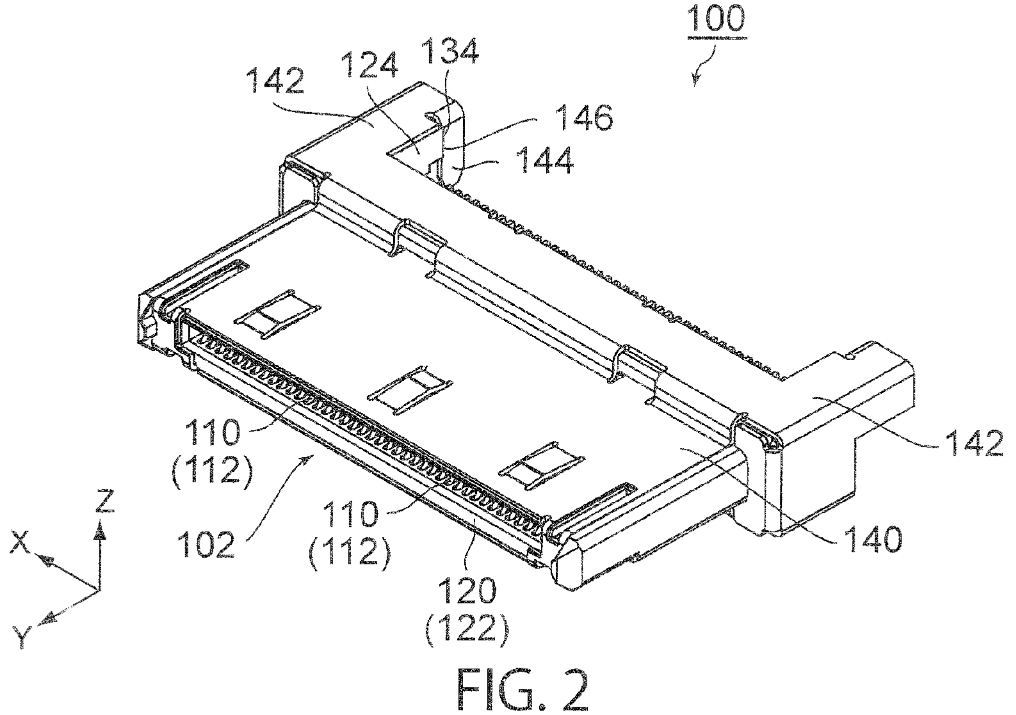
FIG. 2 is a front oblique view showing the connector of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

Figure 3:
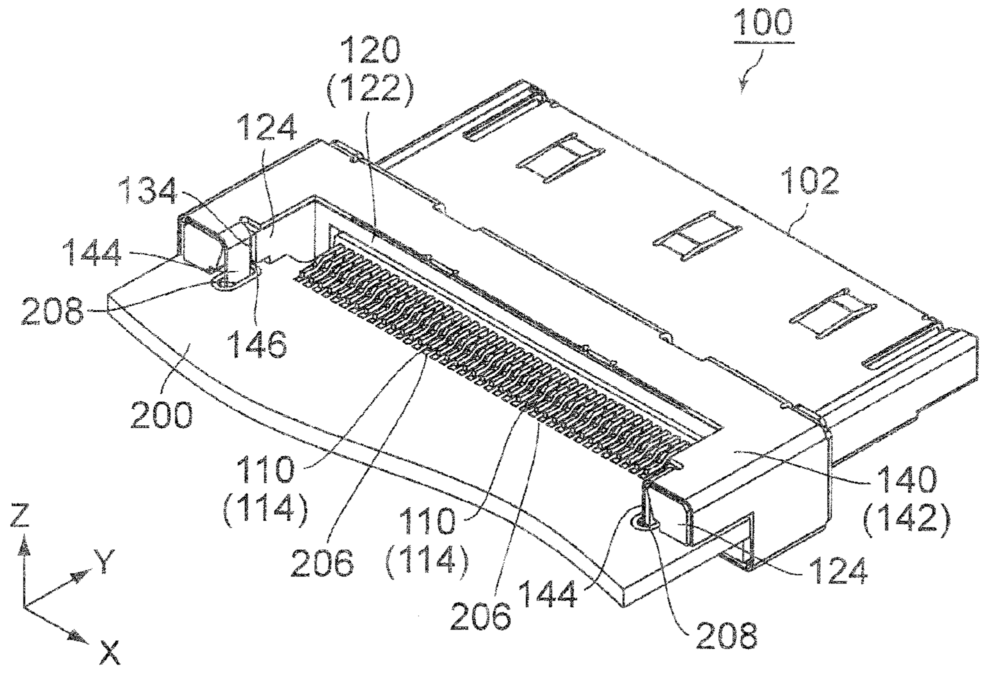
FIG. 3 is a rear oblique view showing the connector of FIG. 1. The illustrated connector is mounted on a board.

With reference to FIG. 1 and FIG. 3, a connector 100 according to the first embodiment of the present invention is a plug connector. The connector 100 has a mating portion 102 to be mated with a mating portion of a mating connector (a receptacle connector: not shown). The mating portion 102 is formed at a +Y (front) side of the connector 100. When in use, the connector 100 is mounted and fixed on a board 200 under the state where the mating portion 102 protrudes from an edge 202 of the board 200 in +Y direction (forward). As shown in FIG. 1, the board 200 is formed with two shoulder portions 204. Each of the shoulder portions 204 is recessed from the edge 202 of the board 200 in the −Y direction (backward). A plurality of pads 206 is formed on the board 200. The plurality of the pads 206 is positioned near the edge 202 and between the shoulder portions 204 in an X direction (a pitch direction). Two through holes 208 are formed on the board 200. The through holes 208 correspond to the shoulder portions 204 in the Y direction. In this embodiment, the through holes 208 are positioned at the back of the shoulder portions 204. When seen along the Y direction, the through holes 208 and the pads 206 differ in position. In other words, the positions of the through holes 208 and the positions of the pads 206 are different from each other in the X direction. In this embodiment, all of the pads 206 are positioned between the through holes 208 in the X direction. In this embodiment, all of the pads 206 are positioned closer to the edge 202 than through holes 208.

As shown in FIG. 1 to FIG. 4, the connector 100 according to the embodiment comprises a plurality of contacts 110 made of metal, a holding member 120 made of insulator and a shell 140 made of metal.

Each of the contact 110 has a contact portion 112 and a contact-fixing portion 114. The contact portion 112 is brought into contact with a mating contact of the mating connector (not shown). The contact-fixing portion 114 is connected with and fixed on the pad 206 on the board 200. The contact 110 has a front part and a back part. The contact portion 112 is formed as the front part while the contact-fixing portion 114 is formed as the back part. In other words, the contact-fixing portion 114 is farther from the mating portion 102 than the contact portion 112.

The holding member 120 has a holding portion 122 and two protrusive portions 124 protruding in the −Y direction (backward) from the holding portion 122. The holding portion 122 holds and arranges the contacts 110 in the X direction (the pitch direction). The contact-fixing portions 114 protrude in the −Y direction (backward) when the contacts 110 are held by the holding portion 122. The holding portion 122 has the end portions in the X direction (the pitch direction). The protrusive portions 124 protrude from both end portions of the holding portion 122 in the direction (backward). In this embodiment, the holding portion 122 has no protrusive member other than the protrusive portions 124 in the −Y direction (backward). However, another protrusive portion which protrudes, for example, over the contact-fixing portion 114 and covers them may be provided to the holding portion 122. When a contact-fixing portion has a pin shape (i.e. an Like shape) having a main portion and a fixed portion to be fixed in a through hole on the board, a protection portion which encloses (holds) the main portion may be provided to the holding member 120.

Figure 5:
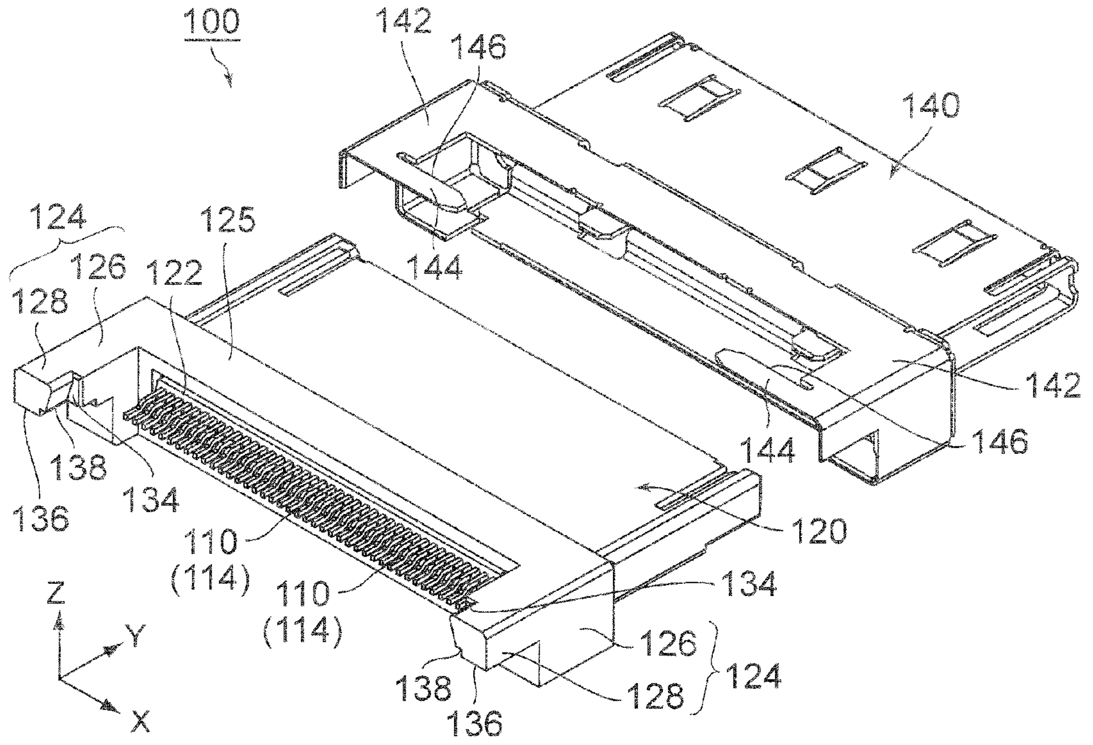
FIG. 5 is an exploded oblique view showing the connector of FIG. 1.
Figure 7:
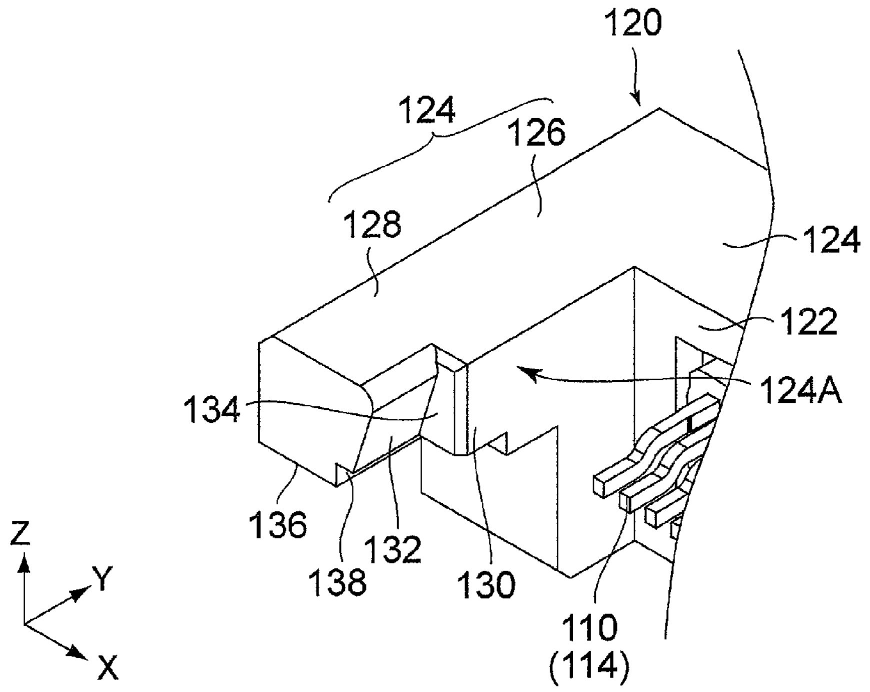
FIG. 7 is an oblique view showing the connector of FIG. 5. The illustrated connector is not attached with a shell.

As shown in FIG. 5 and FIG. 7, the protrusive portion 124 according to the embodiment has a first portion 126 and a second portion 128 smaller than the first portion 126 in the Z direction (an up-down direction). An upper surface of the first portion 126 is flush with an upper surface of the second portion 128. In other words, the upper surface of the first portion 126 and the upper surface of the second portion 128 are same in height in the Z direction. A bottom surface of the second portion 128 is a mount surface 136 to be mounted on the upper surface of the board 200. A bottom surface of the first portion 126 is positioned lower than the mount surface 136. Especially, in this embodiment, the bottom surface of the first portion 126 is positioned lower than bottom surface of the board 200. In other words, a position of the board 200 in the Z direction (the up-down direction) is between the uppermost end and the lowermost end of the first portion 126.

The first portions 126 are positioned forward of the second portions 128. In other words, the first portions 126 are positioned closer to the mating portion 102 than the second portions 128. As understood from FIG. 1 and FIG. 6, the first portions 126 correspond to the shoulder portions 204 of the board 200. The edge 202 of the board 200 is inserted between the first portions 126. Therefore, as understood from FIG. 4, FIG. 5 and FIG. 7, the first portions 126 are positioned on both sides of the plurality of the contact-fixing portions 114 in the X direction (the pitch direction). At least a part of the first portion 126 and at least a part of the plurality of the contact-fixing portions 114 are same in position in the Y direction (the front-back direction: a connection and ejection direction). In other words, when seen along the Z direction, at least a part of the first portion 126 and at least a part of the plurality of the contact-fixing portions 114 are positioned in a straight line. Specifically for the connector 100 according to this embodiment, forward half of the contact-fixing portions 114 in the +Y direction and the first portion 126 are same in position in the Y direction.

Each of the second portions 128 further has a wide portion 130 and a narrow portion 132. As shown in FIG. 7, the narrow portion 132 is smaller than the wide portion 130 in the X direction (the pitch direction). The outer surface of the wide portion 130 in the X direction is flush with the outside of the narrow portion 132. In other words, the outer surface of the wide portion 130 and the outer surface of the narrow portion 132 are same in position in the X direction. When seen along the Y direction, the inner surface of the narrow portion 132 is inclined. In detail, in the inner surface of the narrow portion 132, the lowermost end is positioned outward of the uppermost end. In addition, the inner surface of the wide portion 130 is positioned inner side (i.e. closer to the contact 110) than the inner surface of the narrow portion 132. As a result, a surface facing backward is formed on the wide portion 130. In other words, the surface defines a boundary between the wide portion 130 and the narrow portion 132. As explained later, the surface serves a receiving portion 134. As shown in FIG. 7, the receiving portion 134 is formed at an inner part 124A of the protrusive portion 124 in the X direction (the pitch direction).

Figure 4:
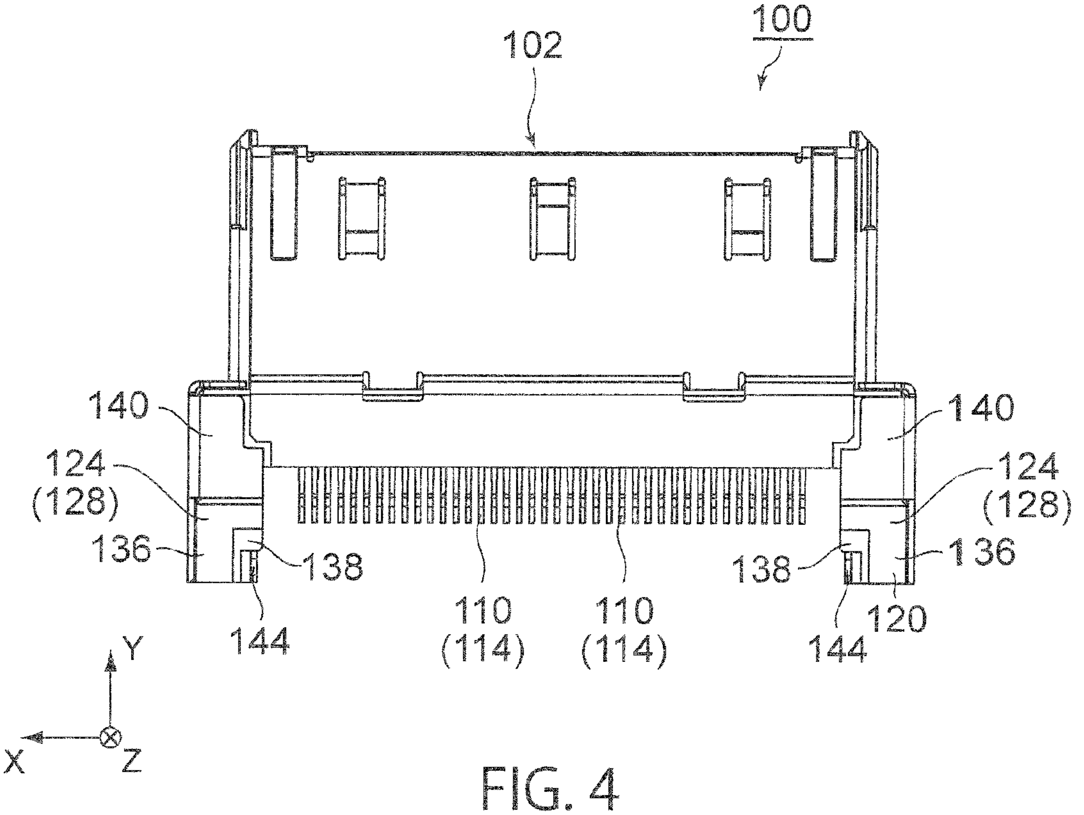
FIG. 4 is a bottom view showing the connector of FIG. 1.

As described above, the bottom surface of the second portion 128 serves the mount surface 136 to be mounted on the board 200. As best shown in FIG. 4, the mount surface 136 has an Like shape. A recessed portion 138 is formed on the bottom surface of the second portion 128. The recessed portion 138 is adjacent to the mount surface 136 and recessed in the +Z direction (upward). As will be described later, the recessed portion 138 serves as a relief space for a solder.

As shown in FIG. 1 to FIG. 4, the shell 140 has an upper portion 142 and a shell-fixing portion 144. The upper portion 142 covers the holding portion 122 and an upper surface 125 of the protrusive portion 124. The shell-fixing portion 144 extends from the upper portion 142 in the −Z direction (downward). The shape of the shell 140 corresponds to protrusive portion 124. As understood from FIG. 5, the shell 140 is formed by bending a blank member obtained by stamping a metal sheet. The shell-fixing portion 144 according to the embodiment is formed to the back part of the upper portion 142. The shell-fixing portion 144 extends from inner edge of the upper portion 142. The shell-fixing portion 144 has a front edge which serves as a stopper portion 146 explained later.

Figure 6:
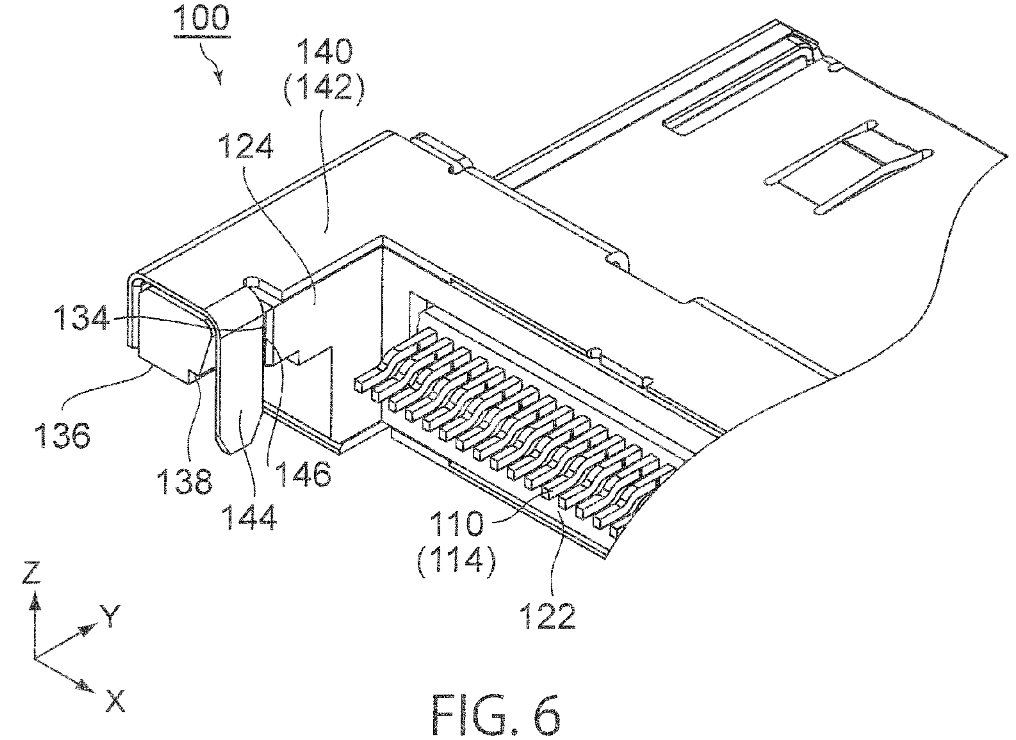
FIG. 6 is a partial-enlarged oblique view showing the connector of FIG. 1.

As best shown in FIG. 5, the shell 140 is attached to the holding member 120 so as to cover the holding member 120. In this state, the shell-fixing portions 144 extend inward in the X direction. Then, as shown in FIG. 6, the shell-fixing portions 144 are bent in the −Z direction (downward). As a result, each of the shell-fixing portions 144 is positioned inwards of a corresponding one of the protrusive portions 124 in the X direction (the pitch direction), and the stopper portions 146 face to the receiving portions 134 in the Y direction (the front-back direction). With this structure, even if the shell 140 is pulled in the +Y direction (forward), the stopper portions 146 of the shell 140 are brought into contact with the receiving portions 134 of the holding member 120 so that the shell 140 is prevented from moving forward and being detached from the holding member 120.

The stopper portion 146 is formed on the edge of the shell 140, i.e. the edge of the metal sheet. In this structure, strength of the stopper portion 146 is high. Therefore, even if the shell 140 is pulled in the +Y direction (forward), the shell-fixing portion 144 is prevented from being deformed.

Moreover, the shell-fixing portions 144 are connected with and fixed on the board 200. Thus, force exerted on the shell 140 in the +Y direction (forward) can be received by both the receiving portions 134 and the board 200. In other words, the force can be shared (dispersed) between the receiving portions 134 and the board 200. Therefore, the connector 100 has a high resistance to the force exerted on the shell 140 in the +Y direction (forward).

As understood from FIG. 3, the shell-fixing portions 144 are inserted into the through holes 208 on the board 200 and fixed by a solder. As understood from FIG. 4, the recessed portion 138 is positioned between the shell-fixing portion 144 and mount surface 136 of the protrusive portion 124. The recessed portion 138 has a relief space for the solder. With this structure, an excessive solder can move into the relief space so that the solder does not come into the space between the mount surface 136 and the board 200.

As best shown in FIG. 4, a distance between the shell-fixing portion 144 and the mating portion 102 is longer than another distance between the contact-fixing portion 114 and the mating portion 102. In other words, the shell-fixing portion 144 is positioned backward of the contact-fixing portion 114. In the present embodiment, the connector 100 is fixed on the board 200 by the contact-fixing portion 114 and the shell-fixing portion 144. The contact-fixing portion 114 and the shell-fixing portion 144 differ in position in the Y-direction. In other words, the connector 100 is fixed on the board 200 by two different points in the Y direction. Therefore, even if force in the Z direction (upward or downward direction) exerts to the mating portion 102 or if the mating portion 102 is tilted, the connector 100 is prevented from being detached from the board 200.

Second Embodiment

Figure 8:
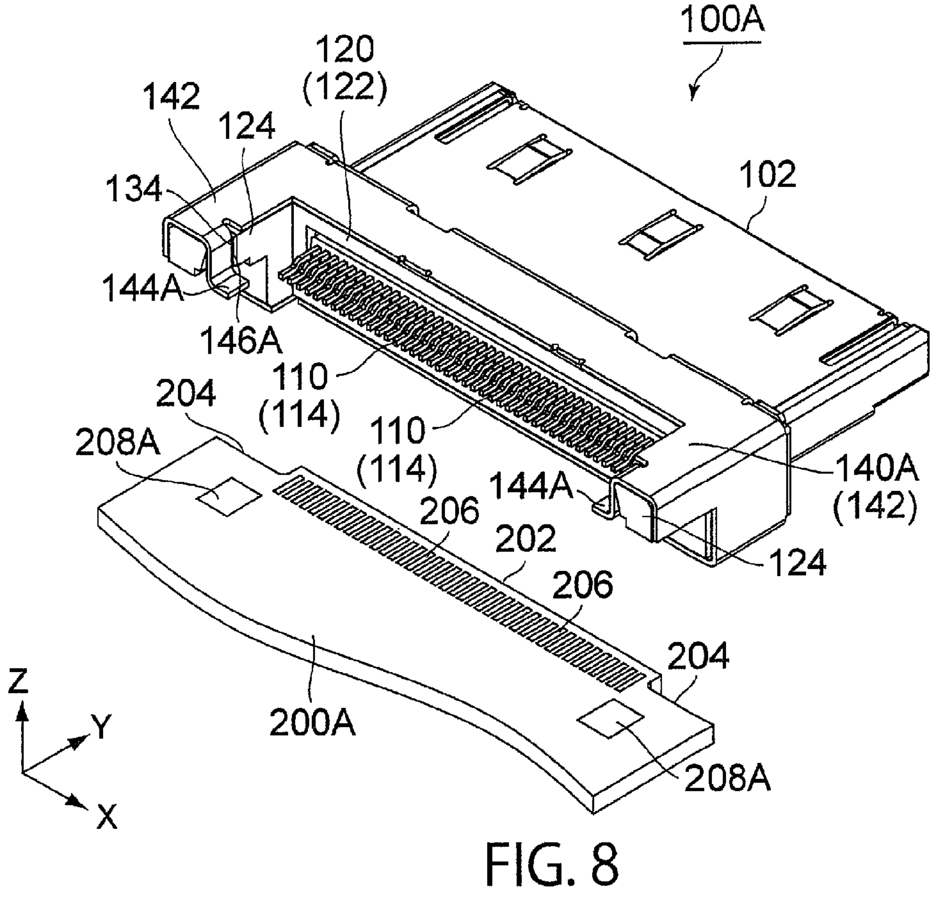
FIG. 8 is a rear oblique view showing a connector according to a second embodiment of the present invention.
Figure 9:
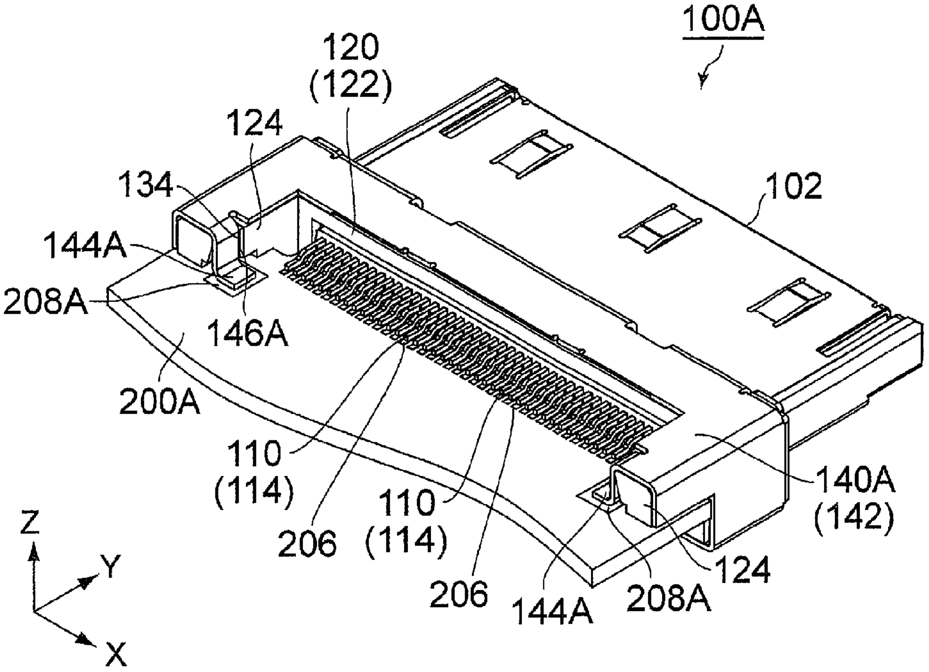
FIG. 9 is a rear oblique view showing the connector of FIG. 8. The illustrated connector is mounted on the board.
Figure 10:
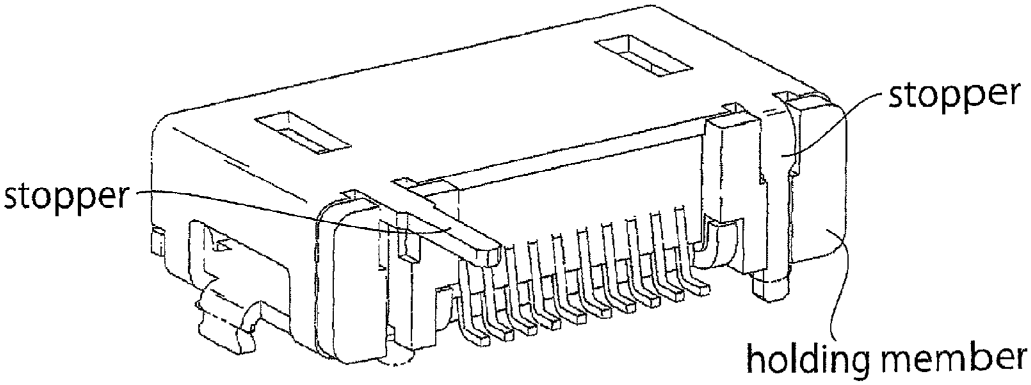
FIG. 10 PRIOR ART
FIG. 10 is a rear oblique view showing the connector disclosed in JP-A 2007-5234.
Figure 11:
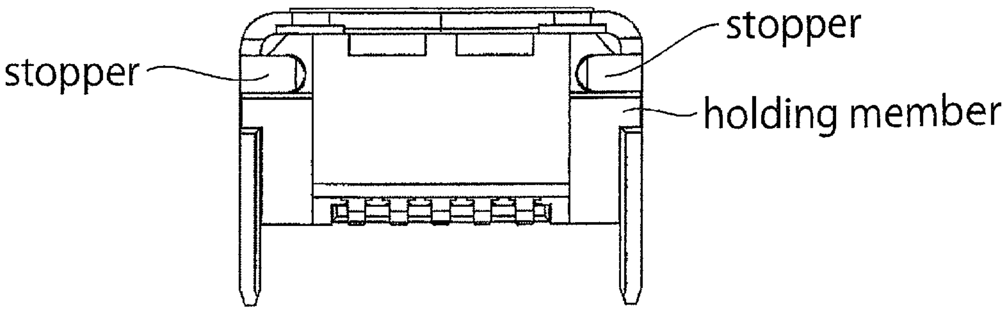
FIG. 11 PRIOR ART
FIG. 11 is a rear view showing the connector disclosed in JP-B 3817489.
Figure 12:
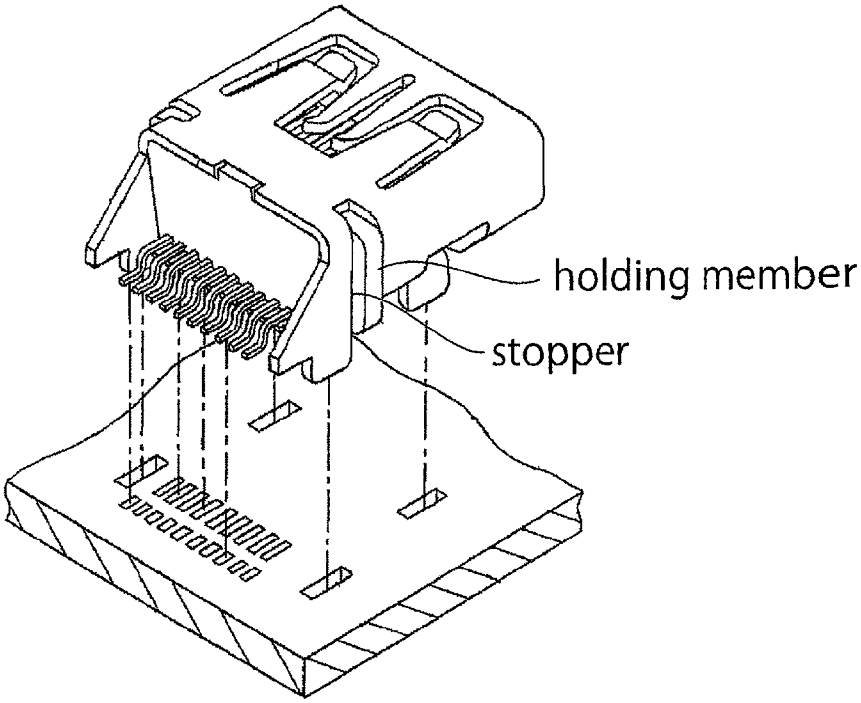
FIG. 12 PRIOR ART
FIG. 12 is a rear oblique view showing the connector disclosed in JP-A 2011-192409.

With reference to FIG. 8 and FIG. 9, the connector 100A according to the second embodiment of the present invention is a variation example of the connector 100 (see FIG. 1 and FIG. 3) of the first embodiment. The connector 100A of the second embodiment comprises almost same structure of the connector 100 of the first embodiment. Therefore, in FIG. 8 and FIG. 9, the same reference numerals are given to the components similar to the first embodiment and, therefore, the detailed descriptions of those components will be omitted.

As shown in FIG. 8 and FIG. 9, the connector 100A of the embodiment is different from the connector 100 (see FIG. 1 and FIG. 3) only in terms of the structure of the shell-fixing portion. A board 200A on which the connector 100A of the present embodiment is mounted is accordingly different from the board 200 of the first embodiment.

To be more specific, as shown in FIG. 1 and FIG. 3, the board 200 of the first embodiment has through holes 208, however, as shown in FIG. 8 and FIG. 9, the board 200A of this embodiment has pads (a shell connection portions) 208A to be connected with shell 140A. The positions of the pads 208A are same as the position of the through holes 208 of the first embodiment. In other words, the pads 208A correspond to the shoulder portions 204 in the Y direction (i.e., the pads 208A are positioned at the back of the shoulder portion 204 in the Y direction). The pads 206 is positioned between the pads 208A in the X direction and forward (in the +Y direction) of the pads 208A in the Y direction. In other words, the pads 206 are positioned obliquely forward of the pads 208A in the Y direction.

As shown in FIG. 8 and FIG. 9, the shell 140A of the connector 100A has shell-fixing portions 144A. The shell-fixing portion 144A has a vertical portion and a horizontal portion (i.e. an L-like shape). The bottom surfaces of the shell-fixing portions 144A are fixed on the pads 208A on the board 200A by solder. The front edge of the shell-fixing portion 144A (the vertical portion) serves as a stopper portion 146A. Therefore, similar to the first embodiment, even if the shell 140A is pulled in the +Y direction, the shell 140A is prevented from being detached from the holding member 120.

The explanation was made about the connector according to the embodiment of the present invention. However, the present invention is not limited thereto.

For example, the above-described connectors 100, 100A are plug connectors; however, the present invention can be applied to a receptacle connector.

The lowermost portions of the connectors 100, 100A are positioned lower than the upper surfaces of the boards 200, 200A. However, the lowermost portions of the connectors 100, 100A may be positioned on the upper surfaces of the boards 200, 200A.

The connector of the present invention is used as, for example, a connector attached to an end portion of the cable to be connected with the mobile electrical apparatus or the like or a connector provided to a cradle or a docking station on which the mobile electrical apparatus is mounted.

The present application is based on a Japanese patent application of JP2012-091522 filed before the Japan Patent Office on Apr. 13, 2012, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector having a mating portion positioned at a front part of the connector and configured to be mounted and fixed on a board in a state where the mating portion protrudes from an edge of the board, the connector comprising:

a plurality of contacts each having a contact-fixing portion to be fixed on the board;

a holding member having a holding portion and two protrusive portions protruding backward from the holding portion, the holding portion holding the plurality of contacts, and each of the protrusive portions including a receiving portion and a mount surface mounted on the board; and a shell covering, at least in part, the holding member and formed by bending a blank member obtained by processing a metal sheet, the shell being provided with a shell-fixing portion to be fixed to the board, the shell-fixing portion corresponding to the protrusive portion and being provided with a stopper portion, the stopper portion being a part of an edge of the blank member and facing the receiving portion in a front-back direction, and a distance between the shell-fixing portion and the mating portion being larger than a distance between the contact-fixing portion and the mating portion;

wherein the holding portion holds and arranges the plurality of contacts in a row and in a pitch direction perpendicular to the front-back direction, the protrusive portions of the holding member are positioned at both ends of the holding portion in the pitch direction and protrude backward of the connector, and the receiving portion of each of the protrusive portions is formed at an inner part of the protrusive portion in the pitch direction; and wherein the shell-fixing portion is formed by bending a part of the blank member to be positioned inwards of a corresponding one of the protrusive portions in the pitch direction.

2. The connector according to claim 1, wherein the board is formed with a through hole passing through the board, and the shell-fixing portion is inserted and fixed in the through hole.

3. The connector according to claim 1, wherein the board is provided with a pad to be connected with the shell, and the shell-fixing portion has a bottom surface to be soldered to the pad.

4. The connector according to claim 1, wherein the mount surface is mounted on a top surface of the board, and a lowermost portion of the connector is positioned lower than the mount surface.

5. A connector having a mating portion positioned at a front part of the connector and configured to be mounted and fixed on a board in a state where the mating portion protrudes from an edge of the board, the connector comprising:

a plurality of contacts each having a contact-fixing portion to be fixed on the board;

a holding member having a holding portion and a protrusive portion protruding backward from the holding portion, the holding portion holding the plurality of contacts, and the protrusive portion including a receiving portion and a mount surface mounted on the board; and a shell covering, at least in part, the holding member and formed by bending a blank member obtained by processing a metal sheet, the shell being provided with a shell-fixing portion to be fixed to the board, the shell-fixing portion corresponding to the protrusive portion and being provided with a stopper portion, the stopper portion being a part of an edge of the blank member and facing the receiving portion in a front-back direction, and a distance between the shell-fixing portion and the mating portion being larger than a distance between the contact-fixing portion and the mating portion;

wherein the shell-fixing portion is fixed on the board by a solder, and the protrusive portion includes a recessed portion, the recessed portion being arranged between the mount surface and the shell-fixing portion and having a relief space for the solder, and the relief space being positioned between the protrusive portion and the board.

6. A connector having a mating portion positioned at a front part of the connector and configured to be mounted and fixed on a board in a state where the mating portion protrudes from an edge of the board, the connector comprising:

a plurality of contacts each having a contact-fixing portion to be fixed on the board;

a holding member having a holding portion and a protrusive portion protruding backward from the holding portion, the holding portion holding the plurality of contacts, and the protrusive portion including a receiving portion and a mount surface mounted on the board; and a shell covering, at least in part, the holding member and formed by bending a blank member obtained by processing a metal sheet, the shell being provided with a shell-fixing portion to be fixed to the board, the shell-fixing portion corresponding to the protrusive portion and being provided with a stopper portion, the stopper portion being a part of an edge of the blank member and facing the receiving portion in a front-back direction, and a distance between the shell-fixing portion and the mating portion being larger than a distance between the contact-fixing portion and the mating portion;

wherein the mount surface is mounted on a top surface of the board, and a lowermost portion of the connector is positioned lower than the mount surface; and wherein the protrusive portion has a first portion and a second portion smaller than the first portion in an up-down direction, the mount surface is formed as a bottom surface of the second portion, a bottom surface of the first portion is positioned lower than the mount surface, the first portion is positioned closer to the mating portion than the second portion in the front-back direction and positioned on both sides of the plurality of the contact-fixing portions in a pitch direction, and at least a part of the first portion and at least a part of the plurality of the contact-fixing portions are in a same position in the front-back direction.

* * * * *

UNITED STATES PATENT AND TRADEMARK OFFICE

CERTIFICATE OF CORRECTION

PATENT NO. : 9,033,714 B2
APPLICATION NO. : 13/860358
DATED : May 19, 2015
INVENTOR(S) : Masaki Kimura et al.

It is certified that error appears in the above-identified patent and that said Letters Patent is hereby corrected as shown below:

In The Specification

Column 1, line 40, delete “JR-B” and insert --JP-B--.

Column 3, line 45, delete “direction” and insert -- -Y direction--.

Column 3, line 51, delete “Like” and insert --L-like--.

Column 4, line 50, delete “Like” and insert --L-like--.

Signed and Sealed this
Twenty-ninth Day of December, 2015

*Michelle K. Lee*

Michelle K. Lee
*Director of the United States Patent and Trademark Office*